United States Patent
Srivastava et al.

(10) Patent No.: US 6,389,688 B1
(45) Date of Patent: *May 21, 2002

(54) METHOD AND APPARATUS FOR CHIP PLACEMENT

(75) Inventors: Nilendu Srivastava, Chelmsford, MA (US); Cyriac Devasia, Nashua, NH (US); Sung Ping Sun, Chelmsford, MA (US)

(73) Assignee: Micro Robotics Systems, Inc., N. Billerica, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/878,004

(22) Filed: Jun. 18, 1997

(51) Int. Cl.[7] .................................................. H05K 3/30
(52) U.S. Cl. .............................. 29/833; 29/740; 29/720
(58) Field of Search ........................... 29/832, 833, 740, 29/741, 720

(56) References Cited

U.S. PATENT DOCUMENTS

| | | | |
|---|---|---|---|
| 3,923,584 A | 12/1975 | Hojo et al. ................. 156/379 |
| 4,404,741 A | 9/1983 | Lebet et al. .................... 29/271 |
| 4,526,646 A | 7/1985 | Suzuki et al. ................ 156/361 |
| 4,657,170 A | 4/1987 | Muller ......................... 228/106 |
| 4,671,446 A | 6/1987 | Sherman ...................... 228/4.5 |
| 4,899,921 A | * 2/1990 | Bendat et al. ............... 228/105 |
| 4,980,971 A | 1/1991 | Bartschat et al. ............. 29/833 |
| 5,092,033 A | 3/1992 | Nishiguchi et al. ........... 29/840 |
| 5,098,501 A | 3/1992 | Nishiguchi ............... 156/275.5 |
| 5,113,565 A | * 5/1992 | Cipolla et al. ............. 29/25.01 |
| 5,131,139 A | * 7/1992 | Oyama et al. ................ 29/721 |
| 5,195,234 A | 3/1993 | Pine et al. .................... 29/720 |
| 5,212,880 A | 5/1993 | Nishiguchi et al. ........... 29/739 |
| 5,348,214 A | 9/1994 | Nishiguchi et al. .... 228/180.22 |
| 5,372,294 A | * 12/1994 | Gore et al. .................. 228/105 |
| 5,383,270 A | * 1/1995 | Iwatsuka et al. .............. 29/840 |
| 5,420,691 A | 5/1995 | Kawaguchi .................. 356/375 |
| 5,518,964 A | 5/1996 | DiStefano et al. ........... 437/209 |
| 5,523,586 A | 6/1996 | Sakurai ........................ 257/48 |
| 5,590,456 A | 1/1997 | Armington et al. ........... 29/721 |
| 5,768,759 A | * 6/1998 | Hudson ................. 29/407.041 |
| 5,854,745 A | * 12/1998 | Muroaka et al. ........ 364/167.01 |

FOREIGN PATENT DOCUMENTS

| EP | 61214528 | 9/1986 |
|---|---|---|
| EP | 0462596 | 12/1991 |
| EP | 0 462 596 A1 | * 12/1991 |

* cited by examiner

*Primary Examiner*—Peter Vo
*Assistant Examiner*—Sean Smith
(74) *Attorney, Agent, or Firm*—George A. Herbster (57) ABSTRACT

A method and apparatus for accurately registering electronic chip bonding pads with substrate leads. Images are developed of different portions of the interface between the electronic chip and the substrate by reflecting collimated, parallel light from the bottom of the chip through transparent areas of the substrate. Image analysis of the composite, superimposed images from spaced positions containing the bonding pads and the leads provide a corrective positioning after which the electronic chip and substrate are brought into contact.

22 Claims, 8 Drawing Sheets

METHOD AND APPARATUS FOR CHIP PLACEMENT

BACKGROUND OF THE INVENTION

1. Field of the Invention

This invention is generally directed to a method and apparatus for bringing a component into register with a support with a high degree of precision. More particularly this invention relates to the precise alignment of an electronic chip on a supporting structure.

2. Description of Related Art

Considerable effort has been directed to developing methods and apparatus for precisely positioning one component, such as an electronic chip, on a second component, such as a supporting structure or substrate of any of diverse forms. In accordance with one prior art approach, a robotic device includes a video system to bring bonding pads on a semiconductor device, as the one component or piece, into registration with leads on a substrate as a supporting structure as a second component or piece. Basically, the video system images features on each of the component and supporting structure when they are at locations remote from a work station at which they will actually be joined. If a control system "knows" the position of the robotic device when each video image is produced and the position of each feature on the component with respect to the position of the supporting structure, calculations can then be made to determine a vector over which one of the components must traverse relative to the other component to be in register. After the traversal is complete, the robotic device brings the two pieces into contact, generally by displacing the semiconductor device to the substrate. In addition to robotic systems manufactured by the assignee of this invention, there are a number of variations on this method and apparatus that are exemplified in the following patents:

U.S. Pat. No. 3,923,584 to Hojo et al. (1975) discloses one such positioning arrangement for providing a face down bonder. The surfaces of the two components to be mated together in registration are established as opposed surfaces; the component positions are adjustable horizontally and vertically. A compound prism comprises a truncated quadrangular right prism with a 45° truncation and a rectangular prism that form a parallelopiped with a half-silvered mirror film at a common interface and with a total reflecting mirror film at a vertical surface of the rectangular prism. When the two components are spaced apart, the prism is interposed between them to allow images to be taken of the two components. Once the images are taken, the optical mechanism is removed, so the two components can be brought together.

U.S. Pat. No. 4,404,741 (1983) to Lebet et al. discloses an alignment device that includes a gripping device for carrying a part over a substrate. An optical device in the form of a microscope or television camera apparently monitors external housing features in order to assure proper alignment.

U.S. Pat. No. 4,526,646 (1983) to Suzuki et al. discloses an inner lead bonder in which a die is fed along a path. It first is positioned at a die defect camera that enables the removal of defective dies. Next a die positional pattern detecting camera images the die at one location. A lead positional pattern detecting camera monitors the positional pattern of leads on a carrier tape. Once these images have been processed, appropriate alignment is made based upon the information in the images produced by the later two cameras.

U.S. Pat. No. 4,657,170 (1987) to Müller discloses a process for bonding an electric component to a connecting tag block in a machine and tape for carrying out the process. An optical instrument 44 is located above a supporting table at which assembly occurs. This enables an operator to see the tape as well as one integrated circuit positioned on the table to determine whether the integrated circuit is properly aligned with the tape. Adjustment of the position is then allowed.

U.S. Pat. No. 4,671,446 (1987) to Sherman discloses a method and system for automatically bonding a lead wire on a semiconductor. In accordance with this method, a contact carrying surface is illuminated at the Brewster's angle with a beam of light rays having a wavelength in the range of the light transmission coefficient of the semiconductor material constituting the chip. Either the illuminating beam or the reflected beam or both are polarized to produce a difference in intensity of the light reflected from the contact and the light reflected from the semiconductor area. The illuminating light passes through a filter to render to a narrow frequency beam of light rays. The result is enhanced contrast in the reflected beam that is more readily digitized for providing inputs to positioning equipment.

U.S. Pat. No. 4,899,921 (1990) to Bendat et al. discloses alignment apparatus in which an optical probe is intermediate a chip and a substrate. The probe illuminates both the counterfacing surfaces of both the chip and substrate and combines the two images into a single image. After the alignment is correct, the probe is withdrawn to allow the chip to be mounted on the substrate.

U.S. Pat. No. 4,980,971 (1991) to Bartschat et al. discloses a system for precisely placing a semiconductor chip on a substrate. A robotic arm with a gripper separately picks up the chip and the substrate. A first television camera, carried by the robotic arm, captures the image of the substrate to locate a pair of datum points. A second camera, that is stationary with respect to the robotic arm, captures the image of the chip when engaged by the robot to locate another pair of datum points. A machine vision system processes the output signals of both cameras to establish the precise location of the datum points on each of the substrate and chip. This controls the robotic arm to cause the gripper to place the chip on the substrate at a precise location.

U.S. Pat. No. 5,195,234 (1993) to Pine et al. discloses a method and apparatus for visual alignment of parts that includes a device, such as a robotic arm, for picking and placing a part on an object. One device moves and removes optics into and out of a work envelope that contains the object. Another device utilizes information from the optics device for locating landmarks on the object within the work envelope thereby to allow alignment of the part with the landmark in the work envelope. After the optics are removed, the two components are displaced relative to each and into contact.

U.S. Pat. No. 5,523,586 (1996) to Sakurai discloses a burn-in socket used in a burn-in test for semiconductor chips that includes a transparent cover member. The cover member is constituted by fixing an inexpensive TAB tape, which can be finally processed, to a transparent member of glass or other transparent material. The chip electrodes of a semiconductor chip to be tested are set in the recess of the chip container and electrically connect to internal electrodes of the chip container by use of leads on the TAB tape. The alignment of the leads, chip electrodes and internal electrodes is facilitated by viewing through the TAB tape from the cover member by video or other means.

U.S. Pat. No. 5,590,456 (1997) to Armington et al. discloses an apparatus for precisely aligning and placing optoelectric components on a substrate. A single camera looks through a transparent alignment tool that holds the component to the substrate below it thus allowing both the component and the substrate to be seen together by the camera. The alignment tool and substrate are adjusted to align the two precisely and then are brought together while being seen by the camera. If the optoelectric component is a laser chip, the chip can be energized while on the glass alignment tool to produce a laser spot that is superimposed on the visible light image via a series of lenses and mirrors.

There now exists a new class of electronic chip-substrate combinations called chip scale packages. The counterfacing surfaces of the chip and substrate carry bonding pads and terminals respectively. The bonding pads are typically about 4 mils square; the leads have a cross section of about 2 mils. In order to assure appropriate placement, the robotic device must align the components to within less than ±1 mil, typically within a tolerance of less than 10 microns.

Each of the foregoing approaches, with the exception of the Armington et al. patent, displaces one component relative to the other after visual images related to their positions have been determined. This relative motion comprises lateral and vertical components and generally involves a significant displacement. Achieving placement accuracies in the ten-micron range while maintaining acceptable rates of operation taxes or exceeds the capabilities of these robotic devices. Moreover, at this requirement for precision changes in temperature require elaborate and time-consuming calibration procedures that further degrade operating speed. As a consequence alternate or supplemental procedures have been suggested to enhance the positioning processes. For example, U.S. Pat. No. 5,518,964 (1996) to DiStefano et al., discloses a microelectronic connection component that is positioned with the leads faced down toward a substrate and onto terminals connected to the substrate in a Z or S fashion.

U.S. Pat. No. 5,348,214 (1994) to Nishiguchi et al. discloses a method of mounting a plurality of semiconductor elements each having bump electrodes on a wiring board by pressing the semiconductor elements to the wiring board while aligning the electrodes and then heating the structure. Any misalignment in the initial positioning of the chip with the board apparently is corrected provided the bump electrodes lie somewhere in the concavity of the electrodes on the wiring board.

U.S. Pat. No. 5,092,033 (1992) to Nishiguchi et al. discloses an alternative approach whereby the steps of electrically connecting at least one pair of bumps on a semiconductor device includes bringing the bumps into contact with a surface of the packaging substrate. The semiconductor device is moved relative to the packaging substrate while monitoring whether electrode terminals formed on the surface of the packaging substrate in at least one pair are electrically connected to each other. Stated differently, a pair of electrodes on the packaging device or different pairs of electrodes on the packaging device may be energized for alignment with interconnected bumps on the semiconductor device. Thus the system will monitor the current flow between the devices when the corresponding pairs of bumps and electrodes are in register.

U.S. Pat. No. 5,212,880 (1993) to Nishiguchi et al. discloses still another alternative in which an optical device is located between the flip chip and the substrate. Coherent light irradiates the bonding head and substrate and light reflected by the bonding head and substrate form interference patterns. The inclination of the bonding head against the substrate is performed by observation of interference fringes caused by the interference between the light reflected from the bonding head and light reflected by the substrate. The disappearance of the interference fringes indicates that the bonding head and the substrate are in exact parallel relationship.

The foregoing patents thereby disclose a number of alternative or supplemental approaches for enhancing the alignment capabilities of prior art assembly apparatus. In accordance with these patents conventional assembly apparatus provides an initial alignment. Final alignment is achieved mechanically, as when bumps on the chip drop into concavities on the wiring board, or electrically, as monitoring different pairs of leads to determine when appropriate conductive paths are established. Each approach increases the time to position and attach a chip to a substrate. This can produce a significant reduction in production rates. The alternative of increasing the inherent accuracy of the robotic devices will increase the costs of such devices to prohibitive levels. What is needed is an apparatus and method that, at a reasonable cost, enable conventional robotic apparatus to achieve the required enhanced positioning accuracy without any significant decrease in production rates, without any significant increase in apparatus costs and with independence of any environmental conditions.

SUMMARY

Therefore it is an object of this invention to provide a method and apparatus for enabling the precise alignment of a component on a supporting structure.

Another object of this invention is to provide a method and apparatus for precisely locating electrical terminals on a supporting structure with bonding pads on an electronic chip.

Still another object of this invention is to provide a method and apparatus particularly adapted for the automated assembly of an electronic chip on a supporting film during the production of a chip scale package.

Still another object of this invention is to provide a method and apparatus for enhancing the capability of conventional assembly apparatus to perform precise positioning of an electronic chip on a supporting structure in an automated manufacturing apparatus with an insignificant impact on production rates.

In accordance with one aspect of this invention, a first component with at least one alignment feature on one surface thereof and a second component with at least one alignment feature at an area of transparency therethrough are brought into a proximate spaced position such that a superposed image of corresponding alignment features on the components can be generated in response to light reflected from the first component. The superimposed image is then analyzed to generate alignment signals that enable final registration of the first and second components.

In accordance with another aspect of this invention, first and second supports positioning first and second components, each having alignment features, maintain the second component at a reference plane while the first support locates the first component proximally to the second component on one side of the reference plane. An image generator having a given depth of field characteristic images the alignment features from the other side of the reference plane when the alignment features are within the depth of field of the image generator. An optical path directs an enlarged image to a location where portions of the enlarged image are converted into electronic video signals that enable the first and second component to be brought into contact in precise registration.

In accordance with still another aspect of this invention, an apparatus for positioning an electronic chip having bonding pads on a planar surface thereof on a substrate with leads formed thereon in transparent areas thereof. A robotic device carries the electronic chip for movement in an x-y horizontal plane and along and about a Z axis perpendicular to the x-y plane. A substrate support maintains the substrate in a horizontal plane. A real time imager generates simultaneously first and second enlarged images of first and second spaced predetermined portions of the substrate and the chip based upon light reflected from the chip. A processor generates alignment signals in response to the first and second enlarged images. A control, that initially aligns the chip and substrate in a closely spaced relation, performs a final alignment in response to the alignment signals and then moves the electronic chip along the Z axis into contact with the substrate thereby to mount the electronic chip to the substrate.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENTS

Figure 1:
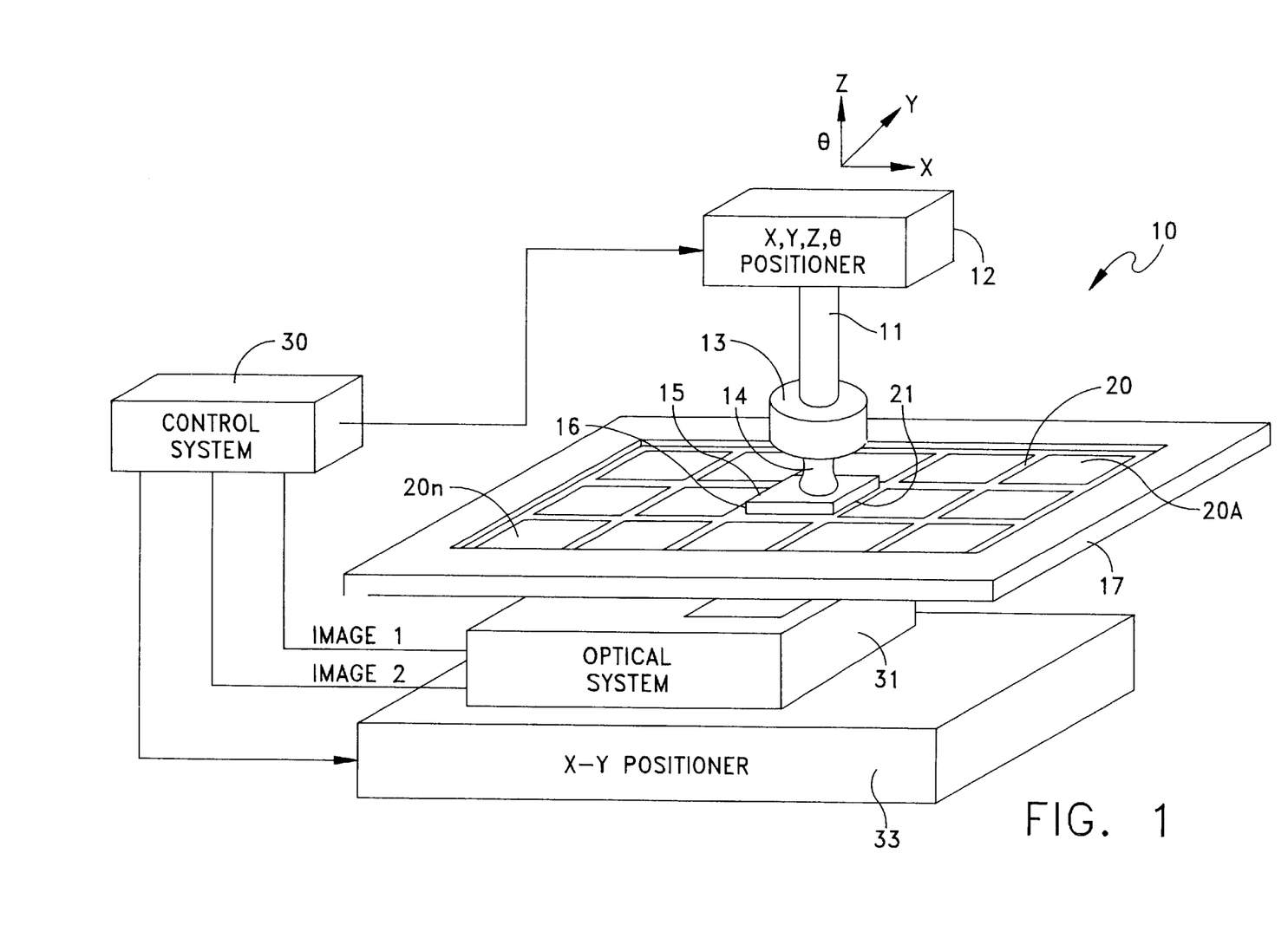
FIG. 1 is a perspective view in block form of apparatus for operating in accordance with this invention.

FIG. 1 schematically depicts a robotic system 10 adapted for implementing this invention. The robotic system 10 includes a robotic arm 11 and a positioner 12 capable of moving the arm 11 in a horizontal x-y plane, and along a vertical, or z axis that is perpendicular to the x-y plane. In addition a chuck 13 at the end of the arm 11 is generally adapted for rotating about the z axis for angular, or Θ, motion. Conventionally the chuck 13 carries a vacuum gripper 14 that contacts an upper surface 15 of an electronic chip 16, as first component, thereby to carry and support the electronic chip or component. The positioner 12 therefore is able to locate the electronic chip 16 in any of "x", "y", "z" and "Θ" degrees of freedom. A substrate support 17, typically a fixture mounted in the robotic system 10, carries a substrate in the form of a tape 20 as a second component having a plurality of leads.

Such robotic systems are well known in the art. Consequently detailed discussions on the computer driven control systems, commands and mechanisms for converting commands into control actions, such as moving the robotic arm, are not included in this description.

Figure 2A:
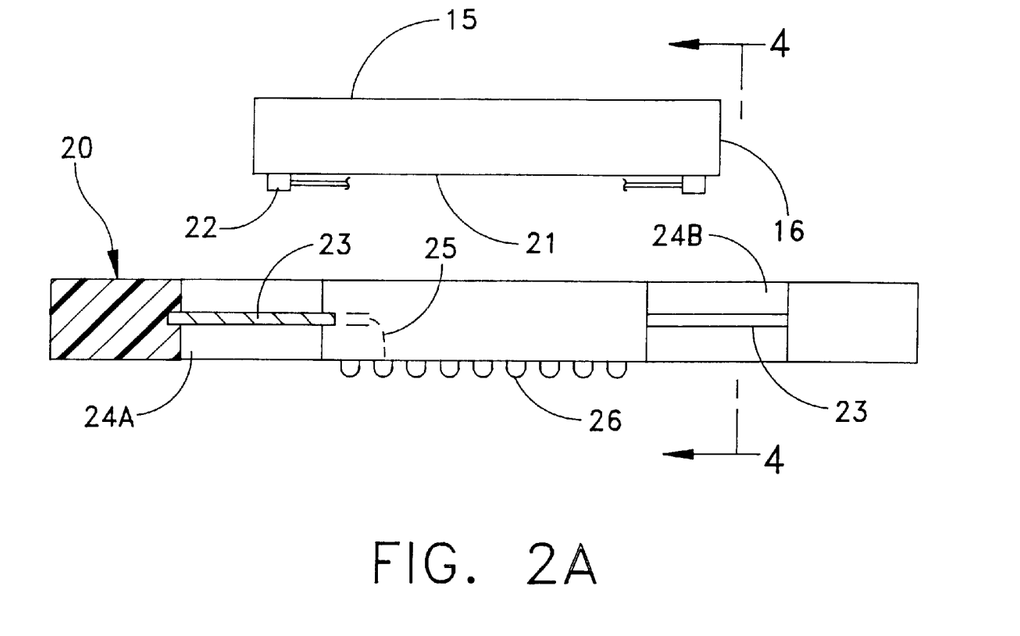
FIGS. 2A and 2B are views, in enlarged form, of an electronic chip and substrate as shown in FIG. 1.
Figure 2B:
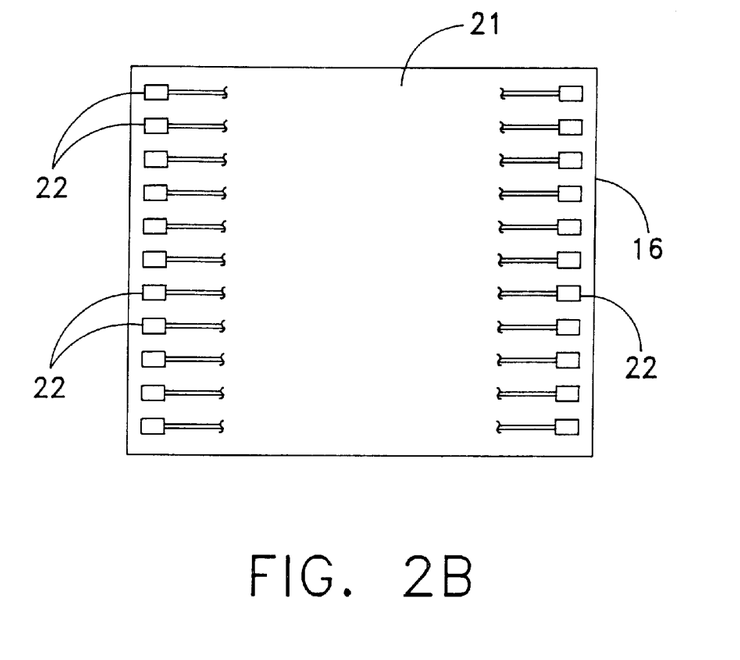

FIGS. 2A and 2B each depict a typical electronic chip 16; FIG. 2A also depicts a typical substrate 20. A bottom surface 21 on the electronic chip 16 includes an array of bonding pads 22 in some predetermined pattern, generally along opposite edges. Bonding pads 22, often called terminals, etc. as previously indicated, are constituted, in one embodiment of electronic chip 16, by 4-mil square conductive surfaces. As will be apparent, the bonding pads can be larger or smaller than and have a shape that differs from the 4-mil square shape of the pads 22 specifically shown in FIG. 2B.

The substrate 20 carries a plurality of conductive leads 23 that are organized in an array and span apertures through the substrate thereby to define areas of transparency 24A and 24B in FIG. 2A. The leads 23 are spaced in the areas of transparency 24A and 24B to correspond to the arrays of the bonding pads 22 at opposite sides or edges of the bottom surface 21. For example, a bonding pad 22 could be a 4-mil square with each lead 23 in the substrate 20 having a width of about 2 mils and being spaced to lie 10–15 mils on center. A conductor run 25 extends from each lead 23 to one of an array of connector pads 26 on the bottom of the substrate. Collectively the pads 26 are more widely spaced over a larger area to facilitate external connections to the electronic chip 16 through the substrate 20.

Referring again to FIG. 1, a control system 30 drives the x, y, z, Θ positioner 12 thereby initially positioning the electronic chip 16 so its surface 21 and bonding pads are spaced from, but closely proximate to, the upper surface of the substrate 20 including its leads 23 such as shown in FIG. 2A. A typical spacing is in the range of 5 to 10 mils. An optical system 31 in FIG. 1 then views alignment features on the chip 16 and the substrate 20 through the transparent areas 24A and 24B and generates IMAGE 1 and IMAGE 2 signals. The control system 30 uses these signals to generate alignment signals that enable the positioner 12 to reposition the electronic chip 16 in the x-y plane and angularly about the z axis in Θ by producing relative motion between the positioner 12 as a first support means and the substrate support 17 as a second support means. Once that positioning is complete, the control system 30 moves the arm 11 and consequently the chip 16 along the z axis to attach the chip 16 to the substrate 20 by adhesive or other means (not shown, but known in the art).

A typical substrate 20 as shown in FIG. 1 has multiple positions 20A through 20n for receiving multiple electronic chips. After one chip has been placed, an x-y positioner 33, that carries the optical system 31, relocates the optical system 31 to illuminate an image at a new chip position. Likewise the x, y, z, Θ positioner 12 picks up another chip and moves to a corresponding position. At the new position the visualization and alignment process occurs again. As will be described later, the fixture 17 may incorporate a substrate support structure that prevents the substrate 20 from stretching or otherwise deforming during the attachment process.

Figure 3A:
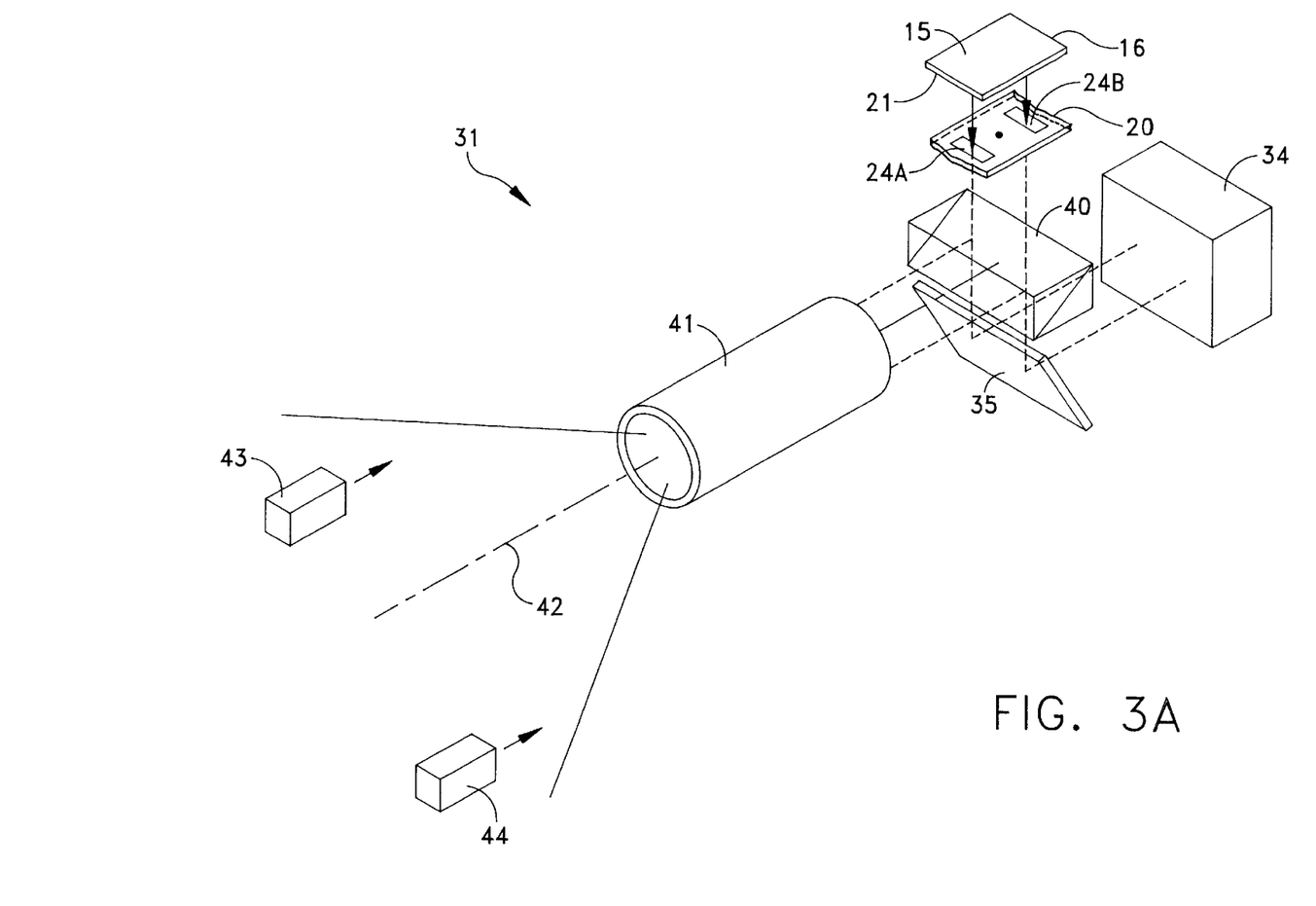
FIG. 3A is a perspective view of an optical path in the apparatus of FIG. 1.

FIG. 3A depicts one embodiment of the optical system 31 in greater detail. A parallel light source 34 directs light to a mirror 35 canted at a 45° angle thereby to illuminate the area of interest, or entire field of view that encompasses both transparency areas 24A and 24B. The leads 23 are visually opaque. Generally both the surface 21 and the bonding pads 22 have a high degree of, but different values of, reflectivity. Consequently light passing through the transparency areas 24 reflects off the surface 21 and bonding pads 22 (FIGS. 2A and 2B) of the electronic chip 16. However, light striking the opaque leads 23 backscatters.

Figure 4:
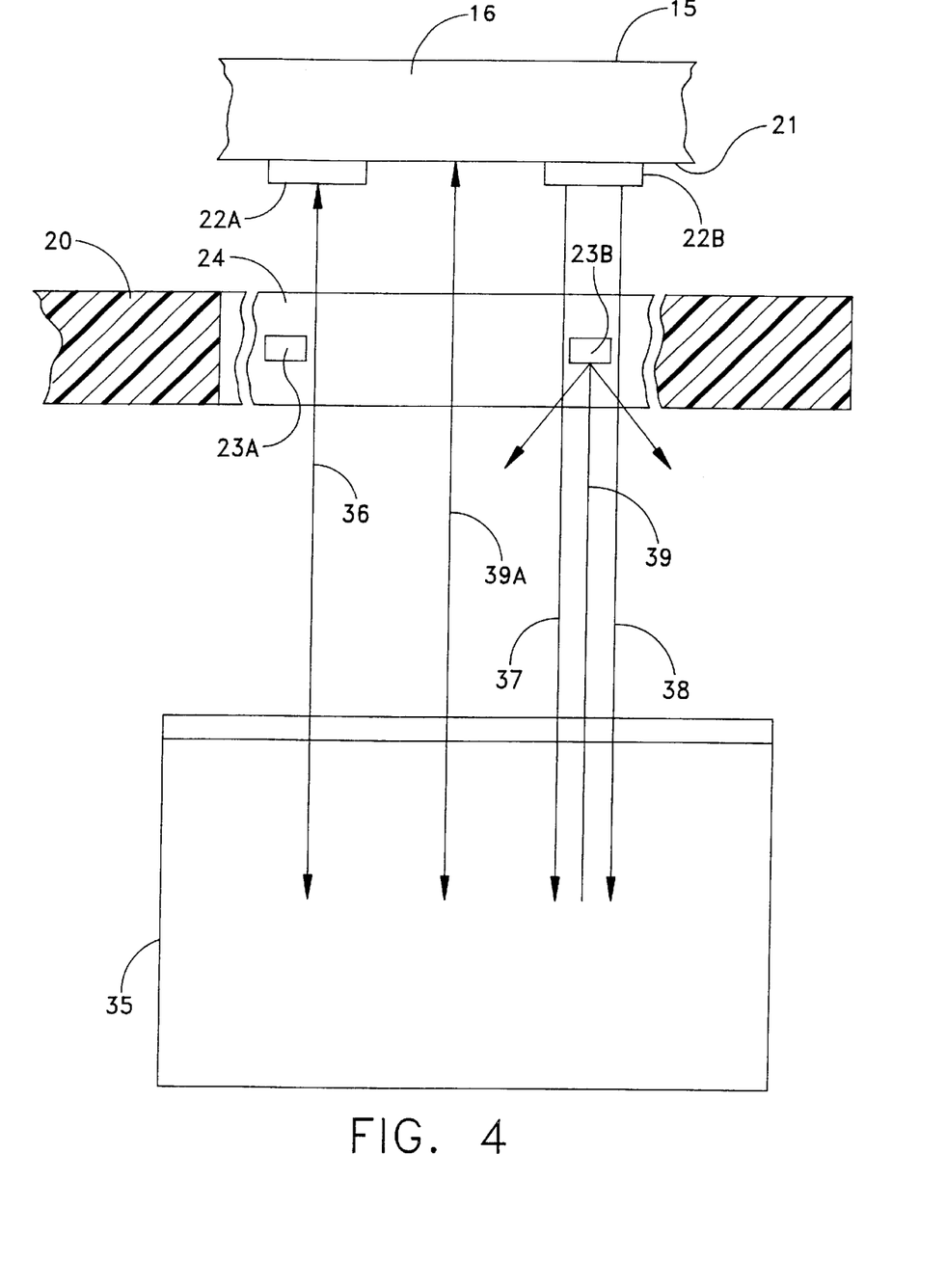
FIG. 4 is an enlarged detail of certain light paths of FIGS. 3A and 3B that will enable a further understanding of this invention.

FIG. 4 depicts two adjacent bonding pads 22A and 22B and corresponding leads 23A and 23B in a simplified cross section to depict the illumination provided by the parallel light from the mirror 35. For purposes of clarity, FIG. 4 omits intermediate optics. In FIG. 4 one light ray 36 from the mirror 35 travels through the transparent area 24 and reflects off the highly reflective mirror surface formed by a bonding pad 22A. Other light rays such as light rays 37 and 38 pass through the transparent area 24 past the lead 23B to reflect off the bonding pad 22B directly back along the incident path and backlight the lead 23B. Another light ray 39, intermediate the light rays 37 and 38, strikes the opaque lead 23. This surface is highly diffractive and essentially backscatters the light randomly so that essentially no light returns along a path parallel to the paths 36, 37 and 38. Other rays 39A reflect from the bottom surface 21 of the electronic chip 16 back through the transparent area 24. The reflected light from the electronic chip 16 therefore carries two images, namely the image of the bonding pads 22 and the image of the leads 23 in superposition. This superposed image contains information by which the alignment of the bonding pads 22 and leads 23 can be attained.

Referring again to FIG. 3A the reflected light then passes to a prism or other beam splitter 40, that may be in line between the mirror 35 and the substrate 20. The beam splitter 40 is transmissive with respect to light from the parallel light source 34 and mirror 35, but the beam splitter 40 reflects or diverts the reflected light and image from the electronic chip 16 to a conventional variable or fixed aperture lens 41. The lens 41 enlarges the image to produce a real image at a back focal point along an axis 42. Functionally, video cameras 43 and 44 are positioned to image different portions of the energized image at this focal point.

Figure 3B:
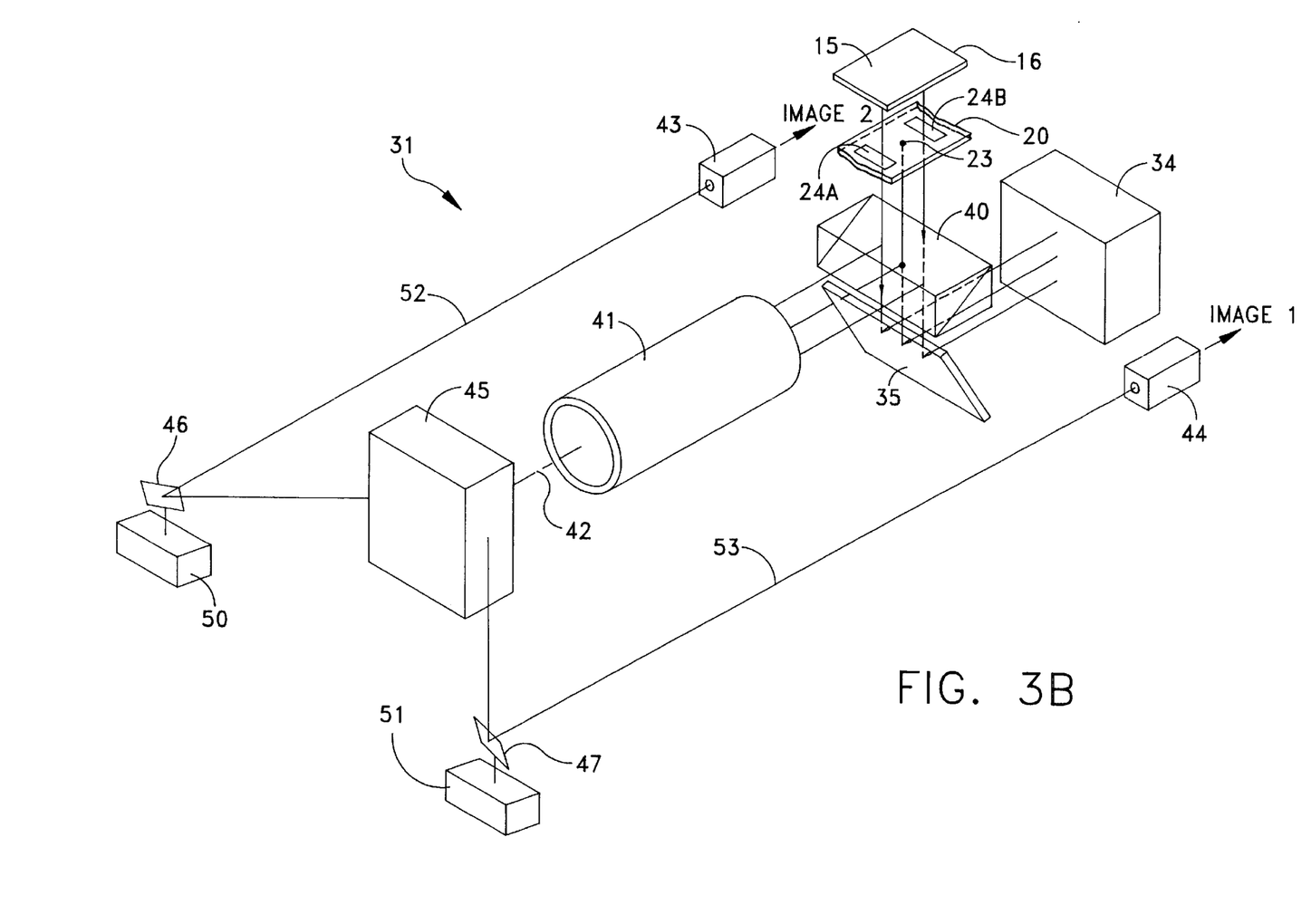
FIG. 3B is a perspective view in greater detail of one portion of the optical path of FIG. 3A.

In an embodiment shown in FIG. 3B a beam splitter 45 on the optical axis 42 diverts the light to a pair of mirrors 46 and 47 that are, in this particular embodiment, below and to the outside of the optical axis 42. Typically the beam splitter 45 will deflect the image in a plane normal to the optical axis 42 and downwardly.

Each of the two mirrors 46 and 47 attach to positioners 50 and 51, respectively. The mirrors 46 and 47 receive the light rays from the beam splitter 45 in a diverging manner and reflect those rays so the image continues to diverge and enlarge even as it reflects back toward video cameras 43 and 44 along axes 52 and 53 respectively. The cameras 43 and 44 are positioned to produce partial images from each of the transparent areas 24A and 24B, typically from opposite ends of these areas.

Each of the cameras 43 and 44 produces electronic signals representing the corresponding image portions they each receive in conventional fashion. Typically the cameras 43 and 44 will be video imaging matrices that provide a pixel by pixel representation of the image and will be located at the back focal point of the lens 41 as shown in FIG. 3A.

While the embodiment of FIG. 3A provides appropriate images, the optical path lengths required for the magnification without introducing undesired aberrations, distortions and the like can be quite long. As a result, it can, in some situations, be difficult to adopt such an optical system with the space constraints of an existing robotic system. FIG. 3B effectively folds the optical path and minimizes the volume required to house the optics. In either embodiment, however, the image produced at the beam splitter 40 is greatly enlarged. In addition, the positioners 50 and 51 of FIG. 3B facilitate system calibration.

Figure 5:
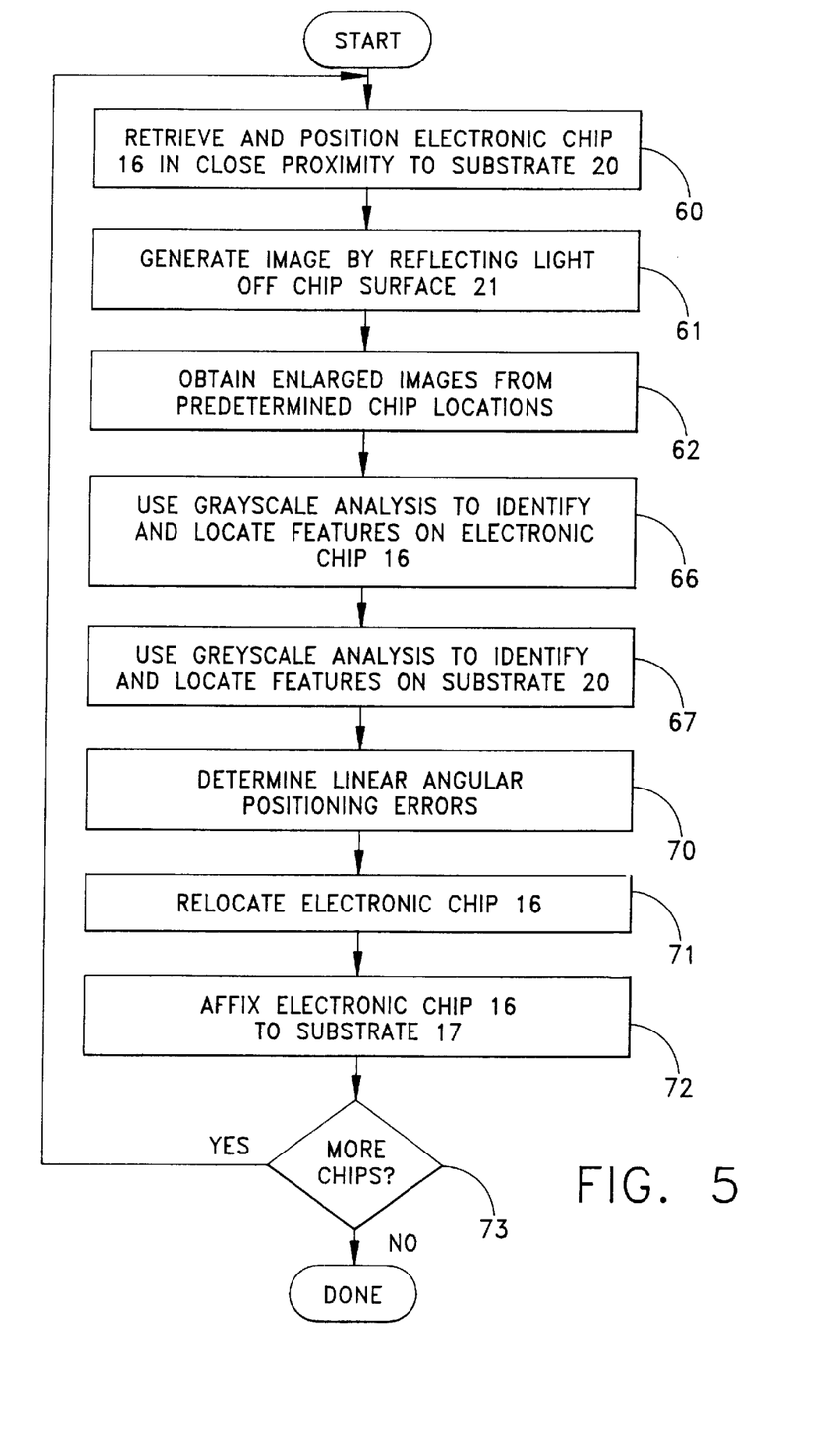
FIG. 5 is a flow chart of the methodology of this invention.

FIG. 5 depicts the process by which the apparatus in FIG. 1, including the optical system 31 in FIG. 3, affixes an electronic chip 16 to a substrate 20 under the control of the computerized control system 30. Step 60 represents the previously mentioned conventional procedures for retrieving the electronic chip 16 from a supply and positioning the chip in close proximity to the substrate 20 as shown in FIGS. 3A and 4. In essence, step 60 produces a rough alignment in the x-y plane and in Θ. The spacing along the z axis between the counterfacing surfaces of the electronic chip 16 and the substrate 20 should be within the depth of field of the optical system 31. As previously indicated, typical spacing should not exceed about 10 mils and typically will be in the order of 5 mils. It is this spacing that constitutes a condition of close proximity.

As will now be apparent, z-axis motion over such a 5–10 mil distance is unlikely to introduce any significant Θ or x-y alignment errors. Consequently, with acceptable tolerance levels, the location of the bonding pads 22 and leads 23 after correction by visualization will be the location of actual contact.

Next, step 61 causes the control system 30 to generate an image by reflecting light off the chip surface 21 as shown in FIGS. 1 and 4. The optical system 31 then directs the enlarged images so discrete portions are received by the video cameras 43 and 44. Normally the locations are chosen to be as widely spaced as possible on the chip.

Figure 6:
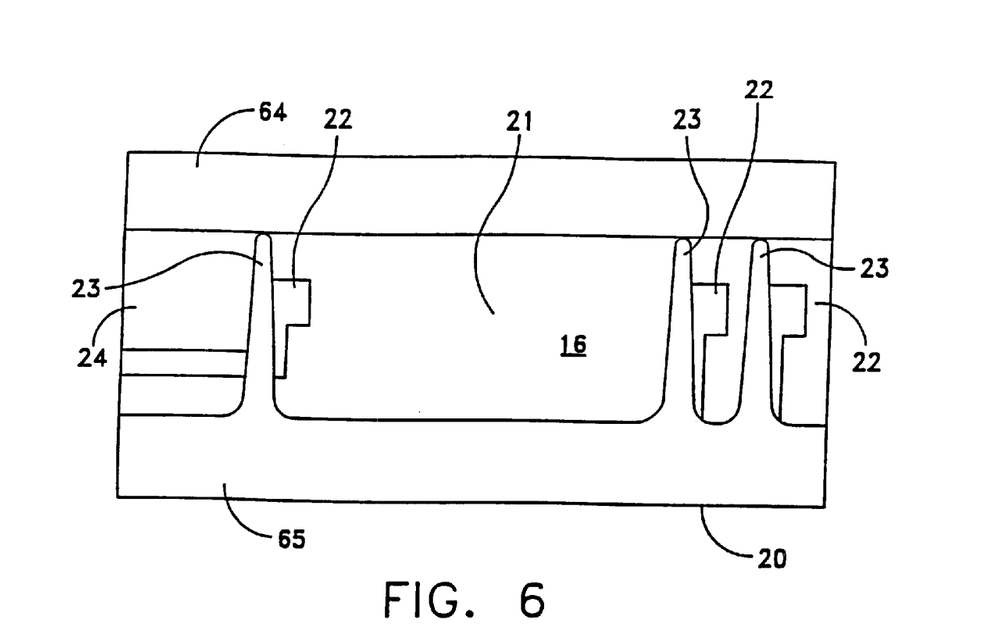
FIG. 6 depicts an image of an approximately aligned electronic chip and substrate.

FIG. 6 depicts a typical image obtained by one of the video cameras 43 and 44 when a misalignment exists. This image depicts several features including bonding pads 22 on the electronic chip 16 and portions of leads 23 that cross the transparency area 24 of the substrate 20. The image of FIG. 6 has essentially three levels of gray. The bonding pads 22 are the lightest or most white because their surfaces have maximum reflectivity. The tape leads 23 and areas 64 and 65 adjacent the transparency area 24 are the darkest because light backscatters from the surface of the substrate 20 as previously indicated. The chip surface 21 has an intermediate gray level because its surface, while reflective, is not so polished as the surface of the bonding pads 22.

The control system 30 in FIG. 1 then uses step 66 in FIG. 5 to perform a conventional image processing analysis to identify and locate the features on the electronic chip 16 by the position of each element defined by the pixels that they occupy. Step 67 identifies the position of features, such as the position of the tape leads 23, on the substrate 20.

Figure 7:
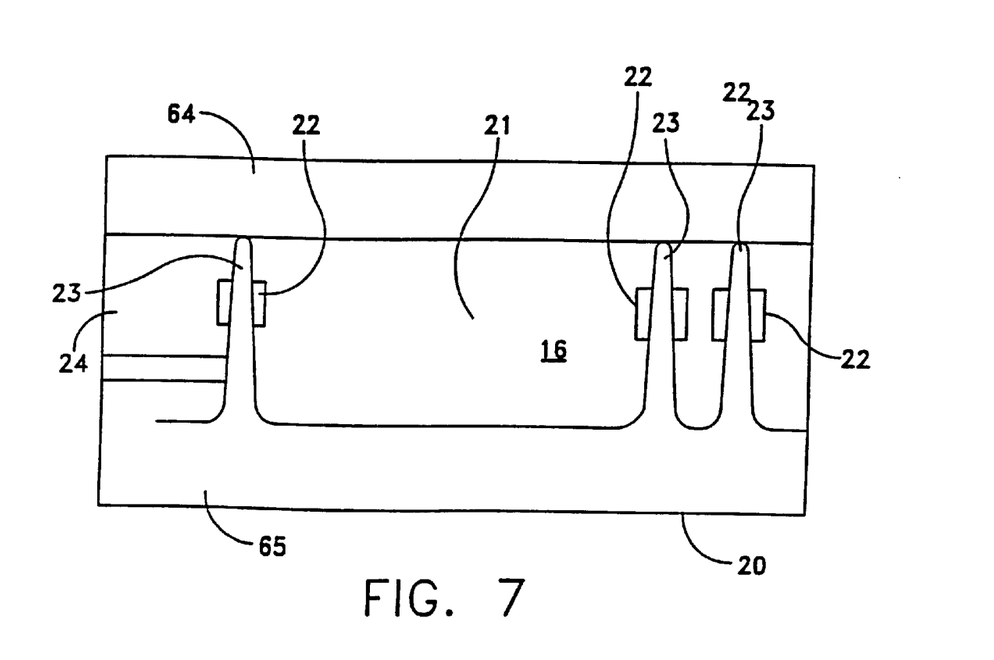
FIG. 7 is an image of a chip and substrate after final alignment in accordance with this invention.

Step 70 in FIG. 5 determines the linear and angular positioning error based upon the location of the features. As shown in FIG. 6, for example, there is a linear positioning error of about the width of one of the tape leads 23 because they lie to the left of the corresponding bonding pads 22 (i.e., an error of 2 mils). Once those errors have been determined, step 71 relocates the electronic chip 16 to the position shown in FIG. 7 wherein each lead 23 is centered on corresponding bonding pad 22 so the electronic chip 16 is brought into registration with the substrate 20 at the selected one of the positions 20A through 20n.

Next the control system 30 uses step 72 to translate the robotic arm 11 in FIG. 1 along the z axis over the short 5-mil to 10-mil distance toward the substrate 20 and affixes the electronic chip 16 in place with the bonding pads 22 on the electronic chip in register with corresponding leads 23 on the substrate 20.

Next the control system 30 determines whether additional chips are to be located in step 73. If all the chips have been mounted to the substrate, the process is complete. Otherwise the control system 30 will return to step 60 to relocate the optical system 31 and the robotic arm 11 as previously indicated so that they are in alignment with another electronic chip position on the substrate 20.

Typically the substrate 20 in FIG. 1 is formed of a film that can stretch if forces are applied perpendicularly to the film 20 as during the process by which the robotic arm 11 actually presses the electronic chip against the substrate. Such stretching can alter the location of the leads 23. To prevent such stretch and thereby further improve the accuracy of the registration of the bonding pads 22 and leads 23, a support for the substrate 20 can be located under a chip position.

Figure 8:
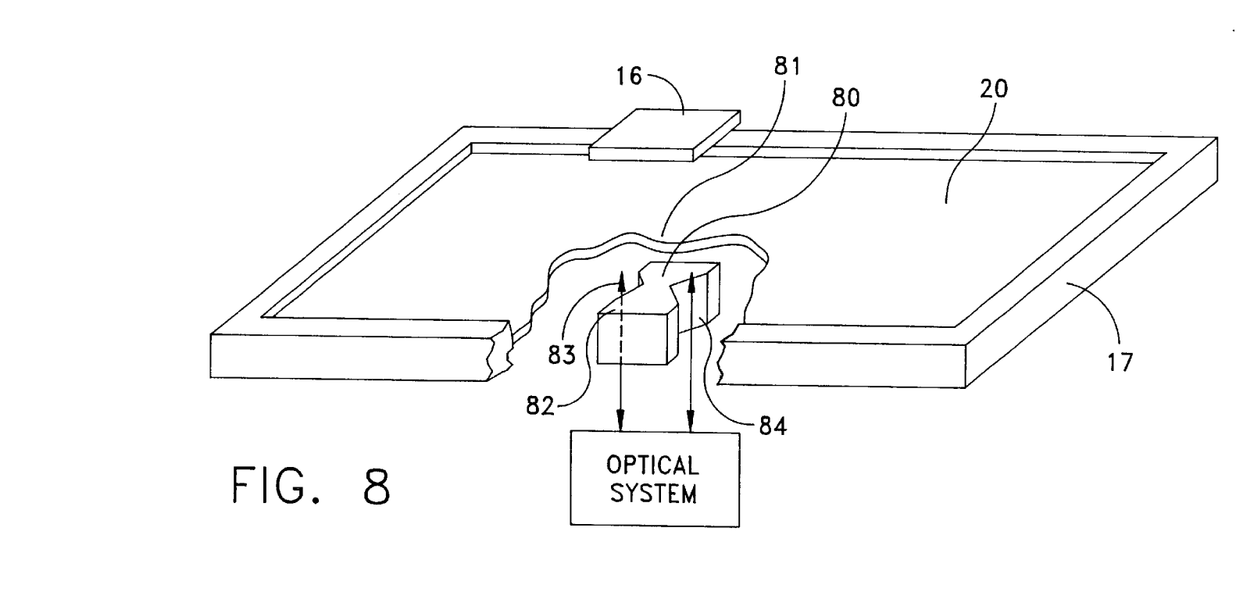
FIG. 8 is a perspective view of one fixture for carrying the substrate.
Figure 9:
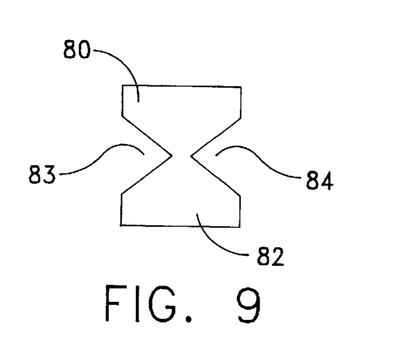
FIG. 9 is a top view of a support shown in FIG. 8.

FIG. 8 shows a support 80 that underlies a chip position 81. The support 80 could also be one support of an array of such supports underlying multiple positions. As shown in FIGS. 8 and 9 an upper planar surface 82 engages the substrate 20 in its plane. In this particular embodiment a v-notch 83 and v-notch 84 are formed on opposite sides of the support 80. The notches are positioned to register with the portions of the image on which the video cameras 43 and 44 are trained. Consequently although the support 80 obliterates portions of the image in the center of the chips, those exposed through the v-notches 83 and 84 will produce images at the video cameras 43 and 44.

Figure 10:
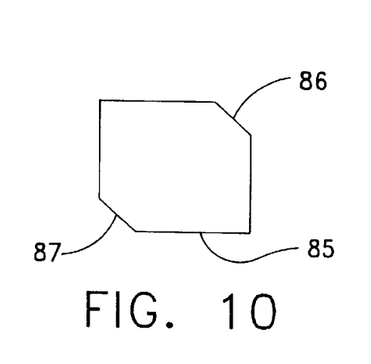
FIGS. 10 and 11 are top plan views of supports that can be used in conjunction with FIG. 8 in lieu of the support shown in FIG. 9.
Figure 11:
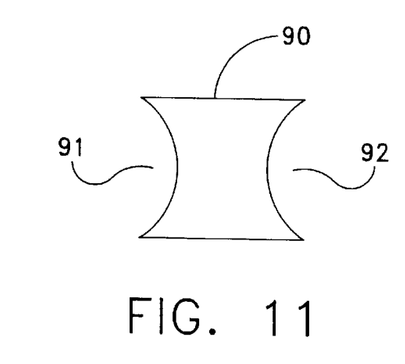

FIG. 10 depicts a support 85 that has chamfered corners 86 and 87. FIG. 11 discloses still another support 90 that has concavities 91 and 92 formed on opposite sides. Still other approaches can be utilized to establish optical paths and will be dependent upon a particular approach which is to be used to provide maximum accuracy of the positioning.

Thus it will be apparent that an apparatus and method according to this invention provide extremely accurate registration of electronic chip bonding pads to supporting substrate leads. This is achieved by apparatus that positions both the electronic chip and the substrate for relative motion with counterfacing surfaces within the depth of field of the optical system, in the order of a few mils. The optical system produces enlarged images preferably from spaced positions on the chip, thereby to enable the quantification of any errors in registration. Once a correction is made, the robotic device merely moves the chip into contact with a substrate that, in the case of tape, may contain a support for preventing any undue stretching of the tape during the affixation process. It has been found that this approach enables placement accuracies of a few microns on a repeatable basis with high production rates using otherwise conventional robotic devices.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed as new and desired to be secured by Letters Patent of the United States is:

1. Apparatus for accurately positioning a first component having at least one alignment feature on a surface thereof and a second component having a transparent area therethrough and at least one alignment feature on a first side thereof in the transparent area, said positioning apparatus comprising:
   A) positioning means for controlling the positions of the first and second components relative to each other, said positioning means locating the first component with its alignment feature surface facing the first side of the second component,
   B) optical means positioned on a second side of the second component that is opposite from the first side whereby the second component is intermediate the first component and said optical means, said optical means generating a superposed image containing the alignment features of the first and second components in response to light reflected from the first component, said optical means including:
      i) a light source directing light through the second component transparent area to the alignment feature surface of the first component along parallel light ray axes that are perpendicular to the alignment feature surface, and
      ii) a lens set that receives the light reflected from the alignment feature surface of the first component past the alignment features in the transparent areas of the second component whereby the light received in the lens set includes a superposed image containing alignment features from each of the first and second components, and
   C) image processing means responsive to the superposed image for generating first and second sets of alignment signals from first and second different portions of the superposed image whereby the first and second sets of alignment signals continuously indicate the relative positions of components thereby to enable said positioning means to maintain the components in register as said positioning means move the components into contact.

2. Positioning apparatus as recited in claim 1 wherein the second component lies in a second component plane and said positioning means includes:
   i) supporting means for supporting the first component for movement relative to the second component, and
   ii) means for moving said supporting means in a plane parallel to the second component plane and in a direction along an axis perpendicular to the second component plane and for rotating said supporting means about the axis.

3. Positioning apparatus as recited in claim 1 wherein the second component lies in a reference plane and said positioning means includes:
   i) means for moving the first component in an x-y plane parallel to the reference plane and in a z plane perpendicular to the x-y plane, and
   ii) means on said moving means for supporting the first component for angular movement relative to the second component.

4. Positioning apparatus as recited in claim 1 wherein said image processing means includes:
   i) first and second video camera means for generating video signals in response to an image presented thereto,
   ii) means for directing first and second portions of the superposed image to said first and second video cameras as enlarged spaced portions of the superposed image, and
   iii) means for converting the video signals corresponding to the enlarged spaced portions of the superposed image into position features representing the positions of the first and second components, and iv) means responsive to the position features for generating the alignment signals.

5. Apparatus for positioning a first component having first alignment features on a surface thereof and a second component having second alignment features in areas of transparency, said positioning apparatus comprising:

A) first and second support means for establishing positions of the first and second components, respectively, with the alignment feature surface of the first component facing the second component, said second support means maintaining the second component in a reference plane and said first support means maintaining the first component in a plane parallel to and on one side of the reference plane, B) optical image generating means having a given depth of field characteristic for generating an optical superposed image of the first and second alignment features, said optical image generating means being positioned on the other side of the reference plane whereby the reference plane is intermediate the parallel plane and said optical generating means, said optical image generating means generating the superposed image in response to light reflected from the first component feature alignment surface past the alignment feature, at the second component transparency areas when the first and second alignment features are within the depth of field, C) video means for converting an image into electronic video signals, D) optical path means for directing spaced portions of the superposed image from said optical image generating means to said video means, and E) means for producing relative motion between said first and second support means in response to the electronic video signals from said video means thereby to bring said first and second components into registration and into contact.

6. Positioning apparatus as recited in claim 5 wherein said second component support means includes localized support means intermediate said imaging generating means and the second component for supporting the second component at a location corresponding to the position of the first component, said localized support means including portions defining visual paths through which an image from the first and second components can pass to said optical path means free of interference.

7. Positioning apparatus as recited in claim 5 wherein said first support means includes robotic positioning means for locating the first component in the plane parallel to the reference plane and for moving the first component in that plane, and along and about an axis perpendicular to that plane, motion along the axis bringing the first component into proximity and contact with the second component.

8. Positioning apparatus as recited in claim 5 wherein said image generating means includes:

i) a parallel light source, ii) means for directing light from said parallel light source perpendicularly to the first surface on the first component through the transparent portion of the second component to define a field of view, iii) optical path means for generating an enlarged image from light reflected from the first surface of the first component through the transparent portion of the second component including a superposed image of the alignment features of the first and second components in the field of view, and iv) means for directing a portion of the enlarged image to said video means thereby to generate an image of the superposed alignment features on the substrate and the chip.

9. Positioning apparatus as recited in claim 8 wherein said video means includes first and second video cameras and said directing means directing first and second spaced portions of the enlarged image to said first and second video cameras, respectively, thereby to generate first and second images of predetermined alignment features the first and second components.

10. Positioning apparatus as recited in claim 9 wherein said first and second video cameras generate images having a grey scale and said means for bringing said first and second support means into alignment includes means for processing the images to identify features according to the grey scale of the enlarged image portions.

11. Apparatus for positioning an electronic chip having bonding pads on a planar surface thereof in register on a substrate with leads formed thereon across at least one transparent area, said positioning apparatus comprising:

A) a robotic device having a chip carrier adapted to be moved in an x-y horizontal plane and along and about a z-axis perpendicular to the x-y plane, B) a substrate support for maintaining the substrate in a horizonal plane, C) real-time imaging means positioned to one side of both said robotic device and said substrate support whereby said substrate support is intermediate said robotic device and said real-time imaging means, said real-time imaging means generating simultaneously first and second enlarged images of first and second spaced, predetermined portions of the substrate and the chip based upon light reflected from the chip past the leads on the transparent areas of the substrate, each image including superposed images of the bonding pads and leads in the predetermined portion, D) processing means for generating alignment signals in response to the first and second enlarged images, and E) control means for initially causing the robotic device to align the chip and the substrate while the chip and substrate are closely spaced, said control means further performing a final alignment in response to the alignment signals and moving the chip support means along the z-axis to contact the substrate thereby to mount the chip to the substrate.

12. A method for positioning a first component with first alignment features on a surface thereof and a second component with second alignment features on transparent areas, said method comprising the steps of:

A) controlling the positions of the first and second components relative to each other with the alignment feature surface of the first component facing a first side of the second component, B) optically generating a superposed image of the first and second alignment features in response to light reflected from the first component, said image generation including the steps of:

i) directing light from a light source positioned on a second side of the second component that is opposite from the first side whereby the second component is intermediate the first component and the light source through the second component transparent area to the alignment feature surface of the first component along parallel light ray axes that are perpendicular to the feature alignment surface, and ii) optically conveying, from the same side of the second component as the position of the light source, selected portions of the light reflected from the alignment feature surface of the first component past the second alignment features through the transparent areas of the second component, each selected portion exiting the second component including a superposed image of at least one alignment feature from each of the first and second components, and C) generating, in response to the superposed image in each portion of the optically conveyed selected portions, alignment signals indicating the relative positions of the first and second components, said controlling step maintaining the first and second components into register in response to the alignment signals as the first and second components are brought into contact.

13. A method as recited in claim 12 wherein said positioning step includes:

i) supporting the first component for movement relative to the second component, and ii) moving the supported first component in a plane parallel to a reference plane and in a direction along an axis perpendicular to the reference plane and rotating the supported first component about the axis.

14. A method as recited in claim 12 wherein the second component lies in a reference plane and said positioning includes:

i) moving the supported first component in an x-y plane parallel to the reference plane and in a z plane perpendicular to the x-y plane, and ii) moving the supported first component angularly relative to the second component.

15. A method as recited in claim 12 wherein said superposed image generation includes:

i) defining first and second portions of the image as first and second enlarged images, and ii) generating first and second sets of video signals in response to first and second enlarged images, iii) converting the video signals corresponding to the enlarged images into position features, iv) generating the alignment signals in response to the position features.

16. A method for positioning a first component having alignment features on a planar surface thereof with respect to a second component with alignment features formed thereon at transparent areas therethrough, said method comprising the steps of:

A) supporting the second component in a reference plane,

B) supporting the first component proximally to the second component on one side of the reference plane with its planar surface facing the second component, C) generating optically, with an image generating means being positioned on the other side of the reference plane whereby the reference plane is intermediate the parallel plane and the image generating means and having a given depth of field characteristic, an image containing the alignment features of the first and second components from the other side of the reference plane in response to light reflected from the planar surface of the first component past the second component alignment features and through the transparent areas of the second component when the alignment features on the first and second components are within the depth of field, D) converting spaced portions of the image into electronic video signals representing enlarged images, E) bringing the first and second components into registration in response to the electronic video signals from said video means, and F) thereafter displacing the first and second components into contact while continuing to maintain the registration of the first and second components in response to the optically generated image.

17. A method as recited in claim 16 wherein said step of supporting the second component includes providing localized support of the second component intermediate the imaging generating means at a location corresponding to the position of the first component, said localized support defining visual paths through which an image of the alignment features of the first and second components can pass to the image generating means free of interference.

18. A method as recited in claim 17 wherein said first component supporting step includes positioning of the first component in a plane parallel to the reference plane and moving the first component in the plane, and along and about an axis perpendicular to the plane, motion along the axis bringing the first component into proximity and contact with the second component.

19. A method as recited in claim 18 wherein said image generating step includes:

i) generating parallel light, ii) directing the light perpendicularly to the alignment features on the first component through the transparent portions of the second component to define a field of view, iii) generating an enlarged image from light reflected from the first component through the transparent portions including alignment features of the first and second components in the field of view, and iv) generating a video image of predetermined features on the first and second components.

20. A method as recited in claim 19 wherein said video image generating step includes generating first and second video images of first and second spaced portions of the enlarged image thereby to generate first and second images of superposed alignment features on the first and second components.

21. A method as recited in claim 20 wherein the video images have a grey scale and said method additionally includes processing the images to identify and locate the alignment features according to the grey scale of the enlarged image portions.

22. A method for attaching an electronic chip having bonding pads along one surface thereof to a substrate having leads formed thereon in at least one transparent area comprising the steps of:

A) positioning the electronic chip in a chip plane in close proximity to the substrate with the bonding pads and leads in approximate alignment with the bonding pads on the chip facing the substrate, B) directing parallel light from a light source on one side of the substrate, the substrate being intermediate the electronic chip and the light source, through the transparent area of the substrate to the electronic chip surface carrying the bonding pads along parallel axes that are perpendicular to the chip plane, C) generating, in an optical generating means positioned on the same side of the substrate as the light source, an enlarged image of at least one portion of an image in the light reflected from the electronic chip surface past the leads and through the transparent area, which image includes superposed images of the bonding pads and leads, D) converting the enlarged image into an electronic signal representing the enlarged image, E) processing the electronic signal to define an alignment error representing any misalignment between the bonding pads and the leads, F) moving the electronic chip in the chip plane to correct the alignment, and G) moving the electronic chip into contact with the substrate while maintaining the alignment between the electronic chip and substrate in response to the generation of the optical image.

\* \* \* \* \*